(12) United States Patent
Huang et al.

(10) Patent No.: US 12,142,574 B2
(45) Date of Patent: Nov. 12, 2024

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Yao-Te Huang, Hsinchu (TW); Hong-Wei Chan, Hsinchu (TW); Yung-Shih Cheng, Hsinchu (TW); Jiing-Feng Yang, Zhubei (TW); Hui Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 441 days.

(21) Appl. No.: 17/390,104

(22) Filed: Jul. 30, 2021

(65) Prior Publication Data
US 2022/0310527 A1    Sep. 29, 2022

Related U.S. Application Data

(60) Provisional application No. 63/166,525, filed on Mar. 26, 2021.

(51) Int. Cl.
*H01L 23/544* (2006.01)
*H01L 21/768* (2006.01)
*H01L 23/522* (2006.01)

(52) U.S. Cl.
CPC ...... *H01L 23/544* (2013.01); *H01L 21/76877* (2013.01); *H01L 23/5226* (2013.01); *H01L 2223/54426* (2013.01)

(58) Field of Classification Search
CPC ............ H01L 23/544; H01L 21/76877; H01L 23/5226; H01L 2223/54426; H01L 23/522; H01L 21/76802; H01L 23/528
See application file for complete search history.

(56) References Cited

U.S. PATENT DOCUMENTS

| | | | |
|---|---|---|---|
| 6,709,974 B2* | 3/2004 | Permana | H01L 21/3212 257/E21.582 |
| 9,659,128 B2 | 5/2017 | Huang et al. | |
| 2008/0277792 A1* | 11/2008 | Lee | H01L 23/522 257/E21.582 |
| 2017/0084529 A1* | 3/2017 | Hsieh | H01L 23/528 |
| 2019/0287932 A1* | 9/2019 | Hu | H01L 24/80 |

* cited by examiner

*Primary Examiner* — Karen Kusumakar
*Assistant Examiner* — Adam S Bowen
(74) *Attorney, Agent, or Firm* — Slater Matsil, LLP

(57) ABSTRACT

Semiconductor devices and methods of manufacturing the semiconductor devices are described herein. A method includes forming an interconnect structure over a device wafer. The device wafer includes a first integrated circuit, a semiconductor substrate, and a redistribution structure. The method further includes forming a metallization layer and a group of dummy insertion structures having a stepped pattern density in a topmost dielectric layer of the interconnect structure. The group of dummy insertion structures and the metallization layer are planarized with the dielectric layer. The method further includes forming a first bonding layer over the group of dummy insertion structures, the metallization layer, and the dielectric layer. The method further includes bonding a carrier wafer to the first bonding layer, forming an opening through the semiconductor substrate, and forming a conductive via in the opening and electrically coupled to the redistribution structure.

20 Claims, 13 Drawing Sheets

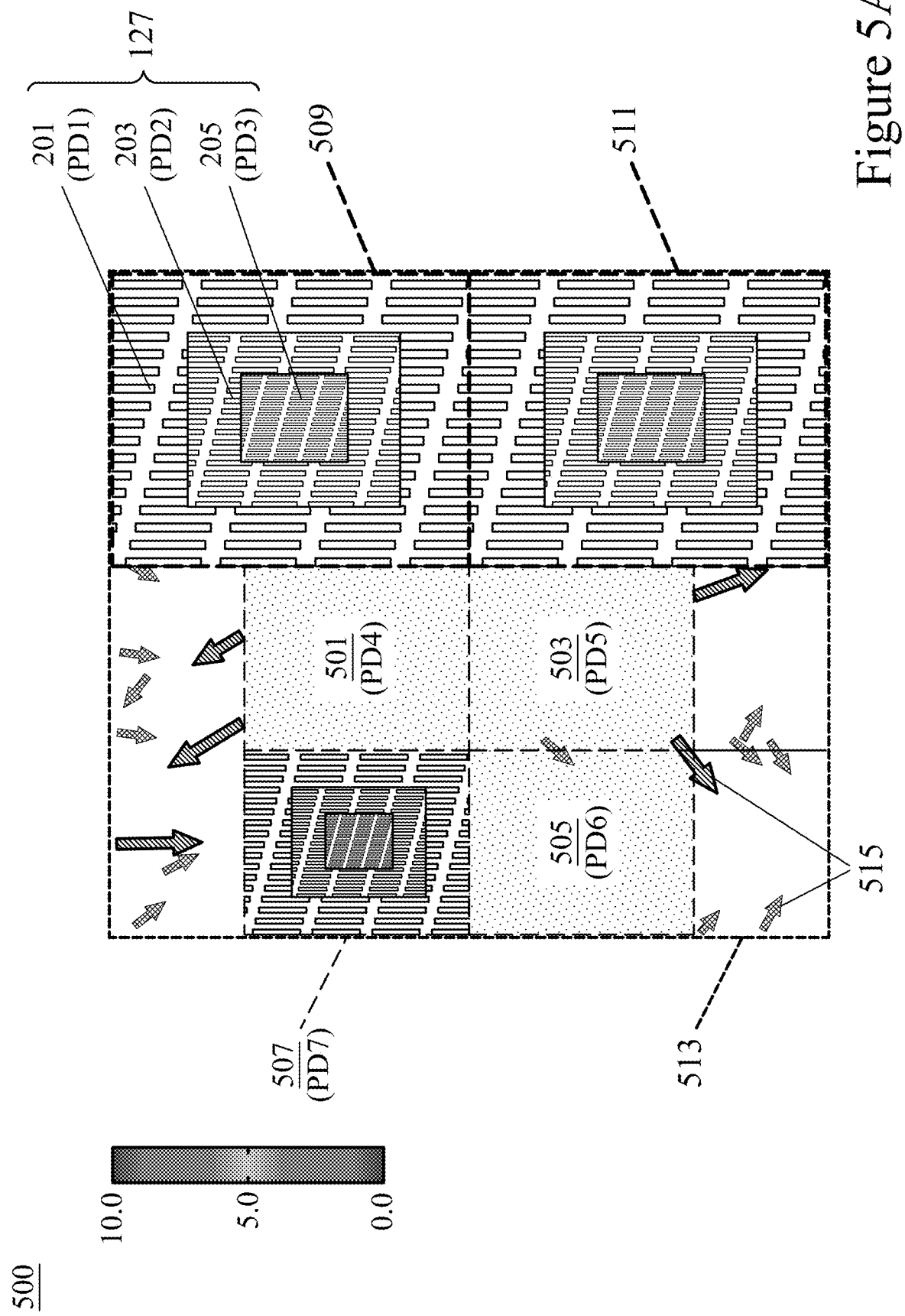

SEMICONDUCTOR DEVICES AND METHODS OF MANUFACTURE

PRIORITY CLAIM AND CROSS-REFERENCE

This application claims the benefit of U.S. Provisional Application No. 63/166,525, filed on Mar. 26, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Furthermore, as more components are integrated into a given area, sophisticated three-dimensional (3D) integrated circuit (3DIC) packaging techniques may be employed to further improve integration density such that even complex systems may be integrated into 3DIC devices. However, as the minimum features sizes are reduced and as more complex systems are integrated into 3DIC devices, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A illustrates a first intra overlay average map of a first group of die regions, according to some embodiments.

DETAILED DESCRIPTION

Figure 1:
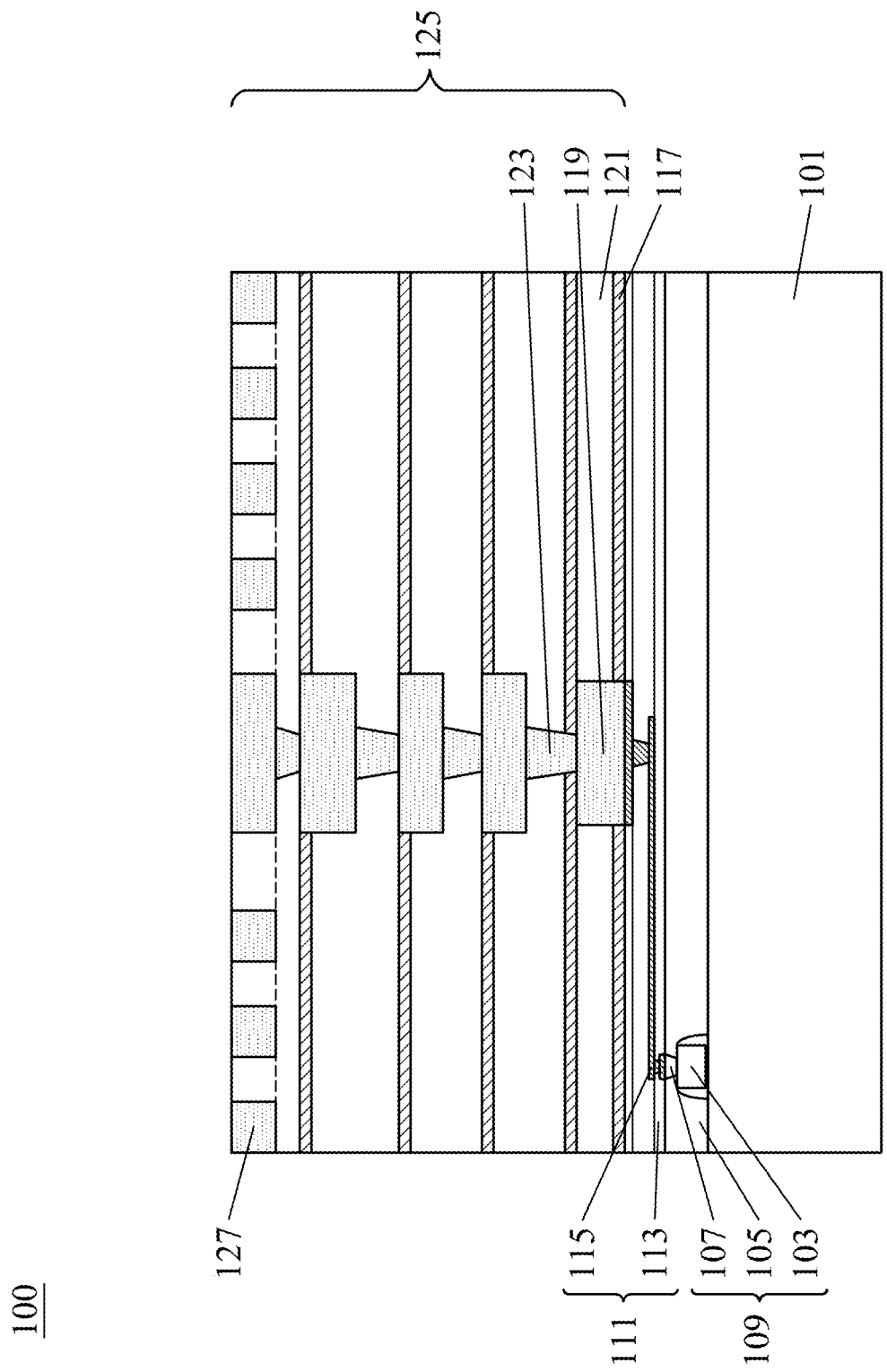
FIG. 1 illustrates a cross-sectional view of forming conductive features in a semiconductor wafer at an intermediate step of manufacturing semiconductor dies, according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to forming patterned dummy features and/or dummy overlays useful in, for example, producing semiconductor devices with aligned metallization layers. Embodiments of forming the dummy overlays may be directed towards identifying pattern densities of neighboring local areas within a metallization layer and providing a uniformity of pattern densities between the neighboring local areas. In some embodiments, a dummy insertion structure is formed within a first local area having a relatively low pattern density as compared to a pattern density of a second local area, the second local area being a neighboring local area to the first local area. In such embodiments, a dummy insertion template may be generated that designates local areas within die regions and/or between die regions as reserved areas for inserting dummy overlays into a design system file. The design system file may be used to generate a production overlay used in manufacturing the semiconductor device. The production overlay is used to form the dummy insertion structure within the designated areas during fabrication of the semiconductor device.

FIG. 1 illustrates a cross-sectional view of a semiconductor wafer 100 in an intermediate step of manufacturing semiconductor dies. In particular, FIG. 1 illustrates forming electronic elements 103 (e.g., transistors, diodes, resistors, capacitors, etc.) in and/or over a semiconductor substrate 101. A first interlayer dielectric (ILD) 105 is formed over the electronic elements 103 and the semiconductor substrate 101.

In an embodiment the semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof.

Other substrates that may be used include multi-layered substrates, gradient substrates, or hybrid orientation substrates. The semiconductor substrate 101 may also be referred to herein as a device wafer, a semiconductor wafer, or a device substrate.

As one of ordinary skill in the art will recognize, a wide variety of devices including active devices and passive devices such as transistors, diodes, capacitors, resistors, combinations of these, and the like may be formed to provide desired structural and functional requirements of the design for the semiconductor wafer 100. The electronic elements 103 may be formed in and/or over the semiconductor substrate 101 using various processes including deposition, etching, implantation, photolithography, annealing, and/or other suitable processes. The electronic elements 103 may also be referred to herein as integrated circuit devices, semiconductor devices, semiconductor components, or the like.

The first ILD 105 comprises one or more dielectric layers that are formed over the electronic elements 103 and the semiconductor substrate 101 to isolate and protect the electronic elements 103. In some embodiments, at least one of the layers of the first ILD 105 is formed of low-k dielectric materials having k values, for example, lower than about 4.0. In some embodiments, the first ILD 105 may be made of, for example, boron phosphorous silicate glass (BPSG), carbon doped oxides, silicon oxide, porous carbon doped silicon dioxide, silicon oxide, silicon nitride, SiCOH, a polymer such as polyimide, combinations of these, or the like and may be deposited by chemical vapor deposition (CVD), physical vapor deposition (PVD), combinations of these, or the like. The first ILD 105 may be formed through a process such as a spin-on process, a chemical vapor deposition (CVD), PECVD, LPCVD, physical vapor deposition (PVD), combinations of these, or the like. The one or more layers of the first ILD 105 may be formed to have a thickness of between about 100 Å and about 3000 Å. However, any suitable materials, any suitable processes, and any suitable thicknesses may be utilized.

Once the first ILD 105 has been formed, first device contacts 107 may be formed through the first ILD 105 and electrically couple to the electronic elements 103. According to some embodiments, the first device contacts 107 are formed using a dual damascene process to initially form openings in the first ILD 105. In an embodiment the openings may be formed in desired locations of the first device contacts 107 by placing and patterning a photoresist material over the first ILD 105. Once the photoresist material has been patterned, a dry etch process such as a reactive ion etch may be utilized to transfer the pattern from the photoresist into the underlying first ILD 105. As such, openings are formed in the desired locations of the first ILD 105 and conductive features of the electronic elements 103 are exposed in the openings. Once the openings have been formed, the photoresist material may be removed, for example, by ashing and/or etching processes.

Once the photoresist has been removed, the openings may be filled or overfilled with a conductive material in order to form the first device contacts 107. In an embodiment, the first device contacts 107 may be formed by depositing an optional barrier layer over the first ILD 105, the optional barrier layer conforming to bottoms and sidewalls of the openings and to an upper surface of the first ILD 105. In some embodiments, the optional barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the optional barrier layer. In some embodiments, the optional barrier layer may be formed to a thickness of between about 20 Å and about 100 Å. However, any suitable materials and thicknesses may be used.

An etching process may be performed to remove the optional barrier layer at the bottom of the opening and re-expose the underlying conductive features of the electronic elements 103. Furthermore, a conductive material may be deposited over the optional barrier layer (if formed), to fill and/or overfill the remaining space within the openings. In an embodiment the conductive material may be a material such as copper, tungsten, ruthenium, titanium dioxide, combinations of these, or the like, formed, e.g., using a seed layer (not shown) and a plating process, such as electrochemical plating, although other processes of formation, such as sputtering, evaporation, atomic layer deposition, or a PECVD process, may also be used depending upon the desired materials. Once the openings have been filled or overfilled with the conductive material, any excess materials outside of the openings may be removed, for example, via chemical mechanical planarization (CMP) to planarize the first device contacts 107 with the first ILD 105. The electronic elements 103, the first ILD 105, and the first device contacts 107 may be collectively referred to herein as a front end of the line (FEOL) layer 109 or device layer.

A first interconnect structure 111 is formed over the electronic elements 103, the first ILD 105, and the first device contacts 107. According to some embodiments, the first interconnect structure 111 includes one or more stacked dielectric layers 113 and first conductive features 115 formed in the one or more stacked dielectric layers 113. Although FIG. 1 illustrates three of the stacked dielectric layers 113, it should be appreciated that the first interconnect structure 111 may include any number of stacked dielectric layers 113 having any number of the first conductive features 115 disposed therein. The first conductive features 115 may include features such as metal lines, conductive vias (e.g., connections), contact plugs, conductive trenches, redistribution lines, conductive pads, or the like. The first interconnect structure 111 may be electrically connected to the first device contact 107 and/or conductive contacts of the electronic elements 103 to form functional circuits. In some embodiments, the functional circuits formed by the first interconnect structure 111 may comprise logic circuits, memory circuits, sense amplifiers, controllers, input/output circuits, image sensor circuits, the like, or combinations thereof. Although FIG. 1 illustrates the electronic elements 103 as a transistor formed over the semiconductor substrate 101, other active devices (e.g., diodes or the like) and/or passive devices (e.g., capacitors, resistors, or the like) may also be formed as part of the functional circuits.

The first conductive features 115 may also be formed in the first ILD 105 to electrically couple the electronic elements 103 with overlying structures, with each other, and also with the first device contacts 107. In an embodiment, the first conductive features 115 within the first ILD 105 may be formed simultaneously with and using the same processes as the first device contacts 107. However, if desired, the further conductive features may be formed using different materials, different processes, and at different times as the first device contacts 107. The first interconnect structure 111 may also be referred to herein as a middle end of the line (MEOL) layer, a redistribution structure, or a redistribution layer.

FIG. 1 further illustrates forming a second interconnect structure 125, in accordance with some embodiments. The second interconnect structure 125 comprises a series of metallization layers 119 (e.g., 6 metallization layers) over the first interconnect structure 111 and a dummy insertion structure 127, according to some embodiments. In the illustrated embodiment, the second interconnect structure 125 comprises a series of etch stop layers 117, inter-metal dielectric (IMD) layers 121, metallization layers 119, and TIVs 123 that are formed one over the other until a desired topmost layer of the metallization layers 119 is formed. The dummy insertion structure 127 is formed within the desired layer to reduce biases between pattern densities of neighboring regions of the desired topmost layer. The second interconnect structure 125 may also be referred to herein as the back end of the line (BEOL) layer.

In particular, FIG. 1 illustrates five metallization layers 119 (e.g., a bottom metallization layer M0, a first metallization layer M1, a second metallization layer M2, a third metallization layer M3, and a fourth metallization layer M4) that are electrically coupled to one another by through inter-layer vias (TIVs) 123, according to some embodiments. The metallization layers 119 may include conductive features such as metal lines, conductive trenches, redistribution lines, conductive pads, and the TIVs 123 may include features such as conductive vias (e.g., connections), contact plugs, or the like that are embedded within one or more of the IMD layers 121. Although five of the metallization layers 119 and four of the TIVs 123 are illustrated in FIG. 1, any suitable number of the metallization layers 119 and the TIVs 123 may be utilized.

The second interconnect structure 125 may be formed by initially forming an etch stop layer 117 over the first interconnect structure 111. The etch stop layer 117 is used to protect the first interconnect structure 111 and to provide a control point for a subsequent etching process, for example, in the subsequently formed metallization layer.

According to some embodiments, the etch stop layer 117 may be formed using materials such as silicon nitride (SiN), nitrides, carbides, borides, carbon doped oxides (e.g., SiOC), or aluminum oxides, combinations thereof, or the like. The etch stop layer 117 may be formed using a plasma enhanced chemical vapor deposition (PECVD), low pressure CVD (LPCVD), PVD, CVD, ALD, combinations of these, or the like, although any suitable deposition techniques may be used.

Once the etch stop layer 117 has been formed, the IMD layer 121 may be formed over the etch stop layer 117. In some embodiments, the IMD layers 121 are formed of low-k dielectric material having k values, for example, lower than about 4.0. In some embodiments, the IMD layers 121 may comprise further dielectric layers made of, for example, an undoped silicon glass (USG) material, boron phosphorous silicate glass (BPSG), carbon doped oxides, silicon oxide, porous carbon doped silicon dioxide, silicon oxide, silicon nitride, SiCOH, a polymer such as polyimide, combinations of these, or the like and may be deposited by chemical vapor deposition (CVD), physical vapor deposition (PVD), combinations of these, or the like. The IMD layers 121 may be formed through a process such as a spin-on process, a chemical vapor deposition (CVD), PECVD, LPCVD, physical vapor deposition (PVD), combinations of these, or the like. The IMD layers 121 may be formed to have a thickness of between about 100 Å and about 3000 Å. However, any suitable materials, any suitable processes, and any suitable thicknesses may be utilized.

According to some embodiments, the metallization layers 119 and the TIVs 123 are formed by initially form openings in the IMD layers 121 and using a dual damascene process to form conductive features within the openings. In an embodiment the openings may be formed by placing and patterning a photoresist material over the etch stop layer 117. Once the photoresist material has been placed and patterned, a dry etch process such as a reactive ion etch may be utilized to transfer the pattern from the photoresist into the underlying the IMD layer 121 to form the openings in desired locations of the metallization layers 119 and/or the TIVs 123 to expose the etch stop layer 117. A second etch process may be performed to remove materials of the etch stop layer 117 at the bottom of the opening and expose the underlying conductive features (e.g., the first conductive features 115, metallization layers 119, and/or the TIVs 123). However, any suitable removal process may be used. Once the openings have been formed, the photoresist material may be removed, for example, by ashing and/or etching processes.

One or more conductive materials may be used to fill or overfill the openings in order to form the metallization layers 119 and/or the TIVs 123 through the IMD layer 121 and in electric connection with the underlying exposed conductive features. In an embodiment, the metallization layers 119 and/or TIVs 123 may be formed by initially depositing an optional barrier layer over the IMD layer 121, the optional barrier layer conforming to bottoms and sidewalls of the openings and to an upper surface of the IMD layer 121. In some embodiments, the optional barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the optional barrier layer. In some embodiments, the optional barrier layer may be formed to a thickness of between about 20 Å and about 100 Å. However, any suitable materials and thicknesses may be used.

Once the optional barrier layer has been formed, an etching process may be used to remove a portion of the optional barrier layer at the bottom of the opening and re-expose the underlying conductive features. The conductive materials may be deposited to fill and/or overfill the openings within the IMD layer 121. In an embodiment the conductive materials may include materials such as copper, tungsten, ruthenium, titanium dioxide, combinations of these, or the like, formed, e.g., using a seed layer (not shown) and a plating process, such as electrochemical plating may be used. However, other processes of formation, such as sputtering, evaporation, atomic layer deposition, or a PECVD process, may be used to deposit the conductive materials depending upon the desired materials. Once the openings have been filled or overfilled with the conductive materials, any excess materials outside of the openings may be removed, for example, via chemical mechanical planarization (CMP) to planarize the metallization layers 119 with the IMD layer 121.

In some embodiments, the dummy insertion structure 127 may be formed within the IMD layer 121 during the formation of the desired topmost layer of the metallization layer 119 (e.g., M4). However, the dummy insertion structure 127 and the desired topmost layer of the metallization layers 119 may also be formed in different processing steps. According to some embodiments, the dummy insertion structure 127 is formed within the IMD layer 121 similar to the metallization layers 119, as set forth above. According to some embodiments, the dummy insertion structure 127 comprises an arrangement of dummy insertion elements having a step pattern density. The dummy insertion structure 127 may also be referred to herein as a dummy insertion arrangement, an arrangement of dummy elements, an arrangement of patterned dummy elements, and/or an arrangement of patterned dummy features.

Figure 2:
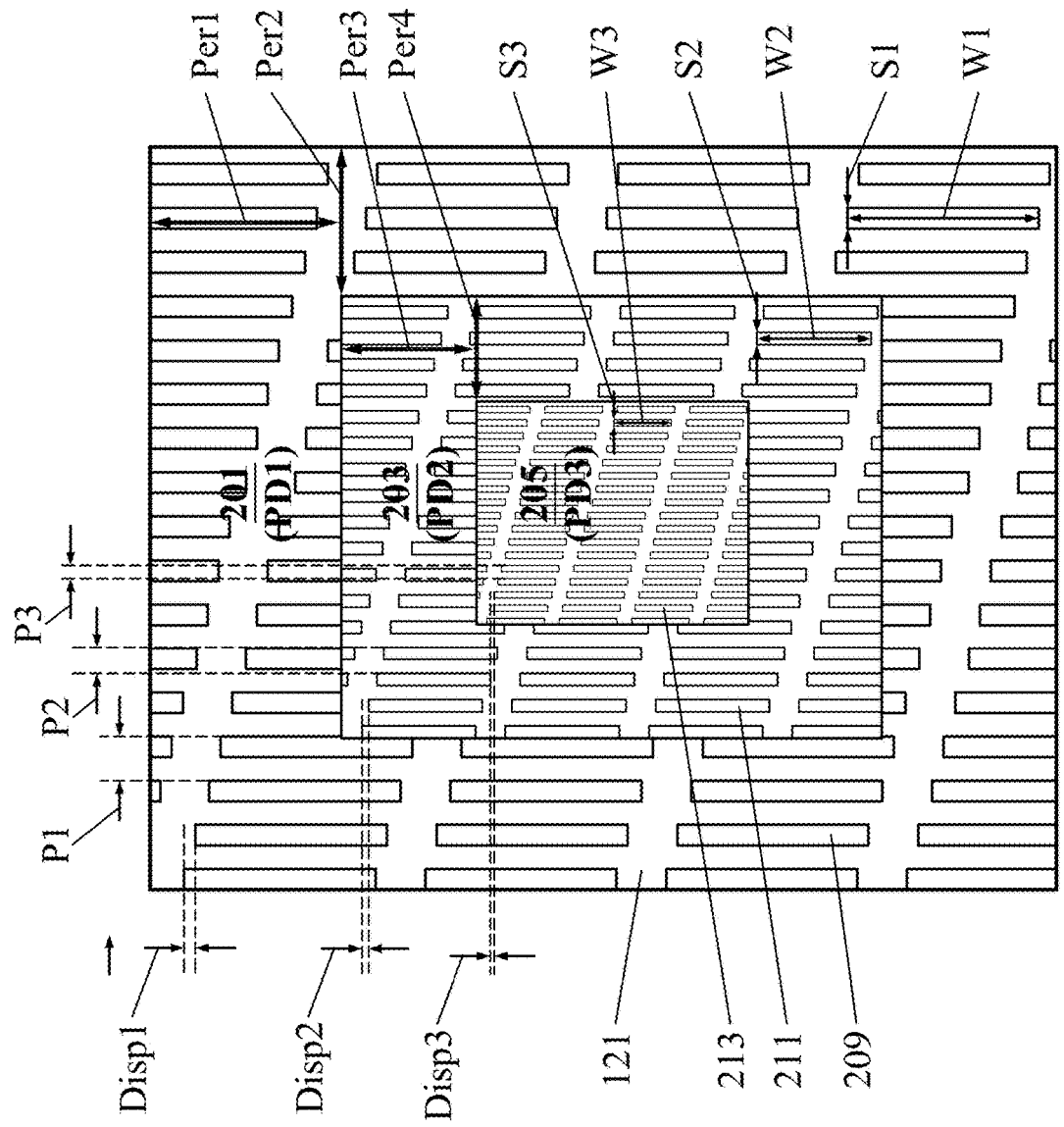
FIG. 2 illustrates a top-down view of a dummy insertion structure, in accordance with some embodiments.

FIG. 2 illustrates a top-down view of the dummy insertion structure 127, according to some embodiments. In some embodiments, the dummy insertion structure 127 may comprise a plurality of areas having graded pattern densities. In the illustrated embodiment, the dummy insertion structure 127 comprises a first area 201 having a first pattern density (PD1), a second area 203 having a second pattern density (PD2), and a third area 205 having a third pattern density (PD3). Although the dummy insertion structure 127 is illustrated and described as having three areas, it is understood that the dummy insertion structure 127 may be formed with any suitable number of areas having any suitable number of pattern densities.

According to some embodiments, the first area 201 may be formed with a pattern of first metallic features 209 within the IMD layer 121 having the first pattern density PD1. In some embodiments, the dummy insertion structure 127 is located adjacent a first die area (not separately illustrated in FIG. 2) of the semiconductor wafer 100, the first die area having a pattern density that is greater than the first pattern density PD1. For example, the dummy insertion structure 127 may be formed with the first area 201 having a first pattern density PD1 that is between about 0.70 and about 0.74 and is formed adjacent to the first die area having a pattern density that is about 0.75. The first metallic features 209 may be formed to a first size S1 of between about 0.064 μm and about 0.189 μm, in accordance with some embodiments. The first size S1 may also be referred to herein as a first length. In some embodiments, the first metallic features 209 are formed to a first width W1 of between about 0.15 μm and about 0.56 μm. The first metallic features 209 may also be formed to a first pitch P1 of between about 0.214 μm and about 0.749 μm in accordance with some embodiments. However any suitable sizes, widths, and pitches may be used. Furthermore, the first metallic features 209 may each be arranged in a first displacement Disp1 from an adjacent one of the first metallic features 209. According to some embodiments, the first displacement Disp1 may be a distance of between about 0 μm and about 0.1 μm. However, any suitable displacement may be used. In some embodiments, the first pattern density PD1 is between about 0.70 and about 0.75. However, any suitable pattern density may be utilized.

According to some embodiments, the second area 203 may be formed with a pattern of second metallic features 211 within the IMD layer 121 having the second pattern density PD2. In some embodiments, the second area 203 is located within the first area 201 having a first location along its perimeter that is a first perimeter distance Per1 from a first location along a perimeter of the first area 201. In some embodiments, the first perimeter distance Per1 is a distance of between about 0 μm and about 2,000 μm. In some embodiments, the second area 203 has a second location along its perimeter that is a second perimeter distance Per2 from a second location along the perimeter of the first area 201. In some embodiments, the second perimeter distance Per2 is a distance of between about 0 μm and about 2,000 μm. However, any suitable distances may be used for the first perimeter distance Per1 and the second perimeter distance Per2. The second metallic features 211 are formed to a second size S2 of between about 0.064 μm and about 0.135 μm, in accordance with some embodiments. The second size S2 may also be referred to herein as a second length. According to some embodiments, the second metallic features 211 are formed to a second width W2 of between about 0.10 μm and about 0.31 μm. The second metallic features 211 are formed to a second pitch P2 of between about 0.164 μm and about 0.445 μm in accordance with some embodiments. However any suitable sizes, widths, and pitches may be used. Furthermore, the second metallic features 211 may each be arranged in a second displacement Disp2 from an adjacent one of the second metallic features 211. According to some embodiments, the second displacement Disp2 may be distance of between about 0 nm and about 0.1 nm. However, any suitable displacement may be used. In some embodiments, the second pattern density PD2 is between about 0.6 and about 0.70, such as about 0.61. However, any suitable pattern density may be utilized.

According to some embodiments, the third area 205 may be formed with a pattern of third metallic features 213 within the IMD layer 121 having the third pattern density PD3. In some embodiments, the third area 205 is located within the second area 203 having a first location along its perimeter that is a third perimeter distance Per3 from a first location along a perimeter of the second area 203. In some embodiments, the third perimeter distance Per3 is a distance of between about 0 μm and about 2,000 μm. In some embodiments, the third area 205 has a second location along its perimeter that is a fourth perimeter distance Per4 from a second location along the perimeter of the second area 203. In some embodiments, the fourth perimeter distance Per4 is a distance of between about 0 μm and about 2,000 μm. However, any suitable distances may be used for the third perimeter distance Per4 and the fourth perimeter distance Per4. The third metallic features 213 are formed to a third size S3 of between about 0.064 μm and about 0.108 μm, in accordance with some embodiments. The third size S3 may also be referred to herein as a third length. According to some embodiments, the third metallic features 213 are formed to a third width W3 of between about 0.07 μm and about 0.09 μm. The third metallic features 213 are formed to a third pitch P3 of between about 0.134 μm and about 0.154 μm in accordance with some embodiments. However any suitable sizes, widths, and pitches may be used. Furthermore, the third metallic features 213 may be arranged in a third displacement Disp3 from an adjacent one of the third metallic features 213. According to some embodiments, the third displacement Disp3 may be distance of between about 0 μm and about 0.1 μm. However, any suitable displacement may be used. In some embodiments, the third pattern density PD3 is between about 0.5 and about 0.6, such as between about 0.52 and about 0.58. However, any suitable pattern density may be utilized.

Figure 3:
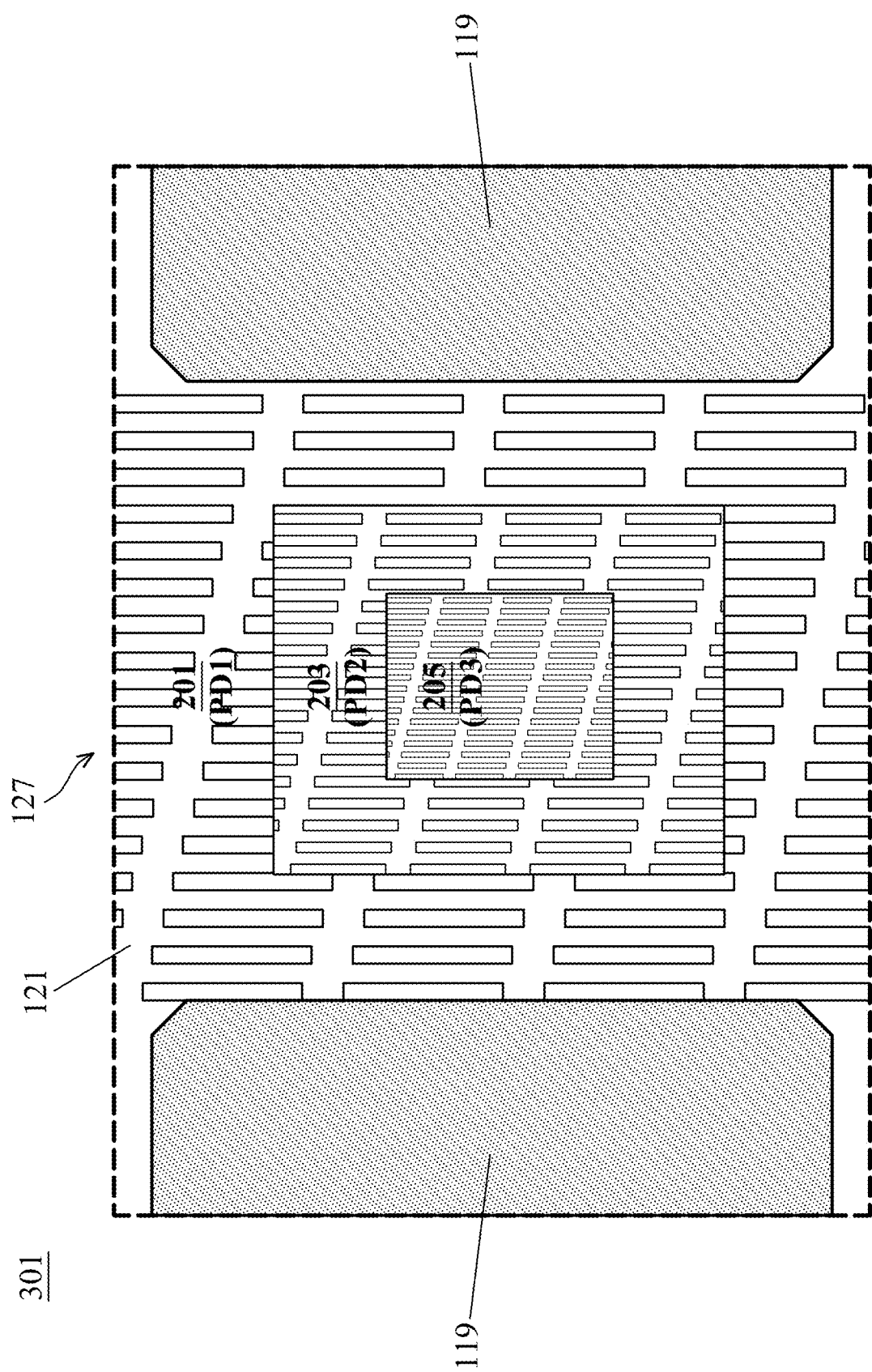
FIGS. 3 and 4 illustrate top-down views of a region of a first semiconductor die and the first semiconductor die, respectively, according to some embodiments.
Figure 4:
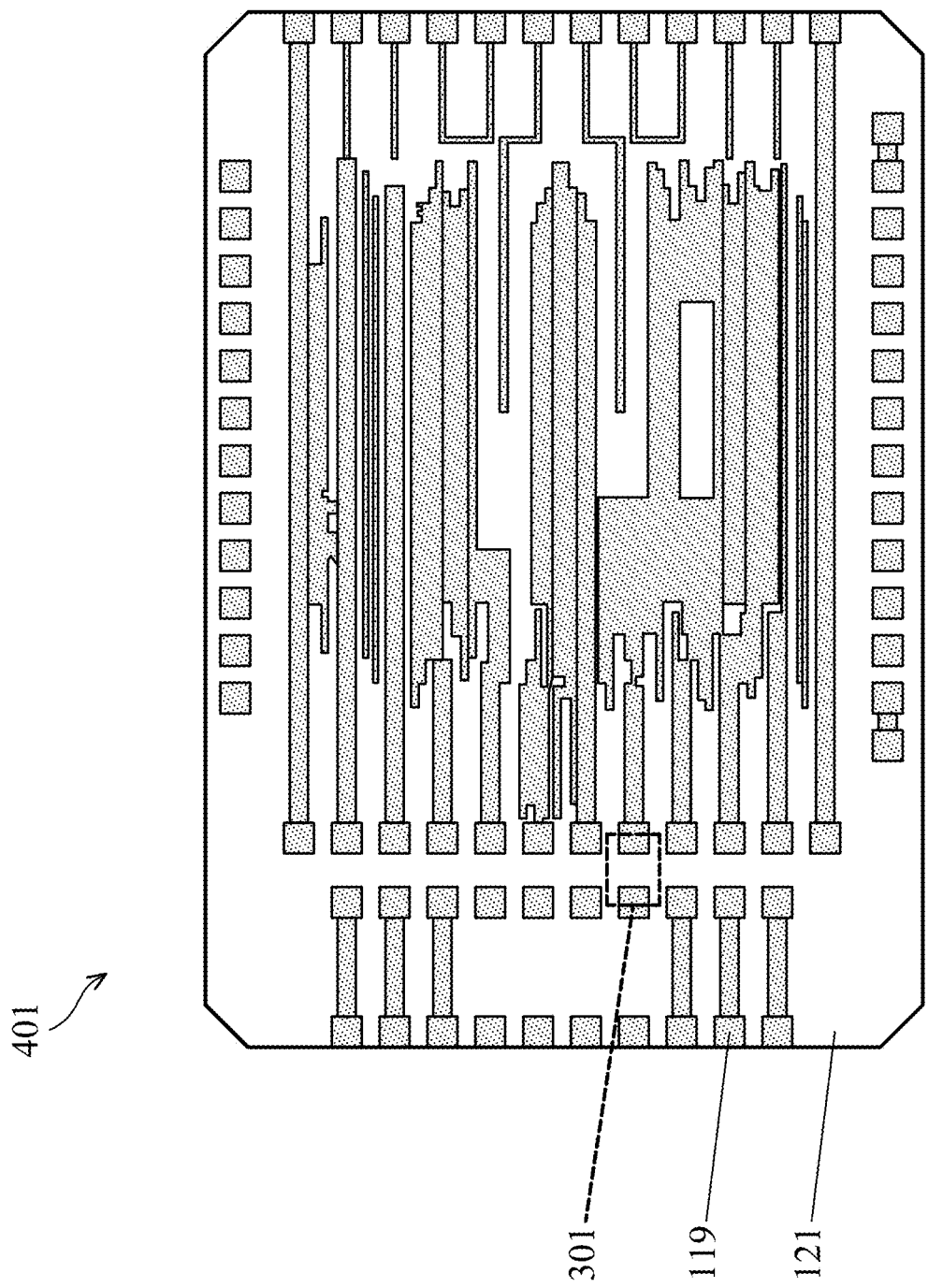

FIGS. 3 and 4 illustrate broader, top down views of a first semiconductor die 401 incorporating the dummy insertion structure 127, according to some embodiments. In particular, FIG. 3 illustrates the dummy insertion structure 127 formed adjacent to the metallization layers 119 formed within the topmost layer of the IMD layer 121 according to some embodiments. The dummy insertion structure 127 illustrated in FIGS. 3 and 4 comprises the first area 201 having the first pattern density PD1, the second area 203 having the second pattern density PD2, and the third area 205 having the third pattern density PD3, according to some embodiments.

FIG. 4 illustrates the first semiconductor die 401, according to an embodiment with the region 301 highlighted by a dashed line. The first semiconductor die 401 comprises metallization layer 119 (e.g., contact pads, conductive lines, or the like) formed within and having coplanar surfaces with the topmost layer of the IMD layers 121. Additionally, the region 301 may have a width of about 0.062 μm and a size/length of about 0.064 μm, with an average pattern density of 0.49. However, any suitable dimensions and average pattern densities may be utilized.

FIG. 5A illustrates a first intra overlay average map 500 of a first group of die regions 513 which incorporates the dummy insertion structure 127, according to some embodiments. In some embodiments, the first intra overlay average map 500 may be a map of a top metallization layer (e.g., the top layer of the second interconnect structure 125) of the semiconductor devices to be formed. In some embodiments, the top metallization layer may be part of the second interconnect structure 125 and embedded in the IMD layers 121.

FIG. 5A additionally illustrates a first set of overlay vectors 515 (e.g., the amount of overlay displacement caused by each region) that is caused by each region, based upon the pattern density within each region. As can be seen, the fourth pattern density PD4 of the first die region 501 (relative to the pattern density of the surrounding areas) will cause overlays to undesirably shift as indicated by the first set of overlay vectors 515. The differences in pattern density between the remaining regions relative to their respective surrounding regions will cause similar overlay shifts, and these shifts can be measured or modeled.

Once the first set of overlay vectors 515 have been determined, the first set of overlay vectors 515 may be used to determine where to place and include the dummy insertion structure 127 within the dielectric material of the top metallization layer during fabrication of semiconductor devices. For example, by incorporating the dummy insertion structures 127 in adjacent locations where a large vector of the first set of overlay vectors 515 is present, thereby reducing the differences in pattern density and improving the overall intra overlay average of the illustrated region. For example, an intra overlay average of the region illustrated in FIG. 5 may have an average local pattern density bias of between about 12 to about 13 prior to designating any of the die regions for incorporation of the dummy insertion structure 127. After designating some of the die regions for incorporation of the dummy insertion structure 127, an intra overlay average of the illustrated region may have an average local pattern density bias of between about 2.7 to about 3.3.

Looking in closer detail at the individual regions within FIG. 5A, FIG. 5A illustrates the first group of die regions 513 comprising: a first die region 501, a second die region 503, a third die region 505, a fourth die region 507, a fifth die region 509, and a sixth die region 511. FIG. 5A further illustrates the first set of overlay vectors 515 associated with each of these die regions prior to the inclusion of the dummy insertion structures 127 (which are illustrated in FIG. 5A for convenience). Each of the die regions may have a unique pattern density and depending on these unique pattern densities, a unique set of the first set of overlay vectors 515 may be determined for each of the die regions. Furthermore, each of the first set of overlay vectors 515 has a magnitude and a direction based on the pattern density of the metallic features and the material integrity of the dielectric material (e.g., USG) within the neighboring die regions.

In the illustrated embodiment of FIG. 5A, the first die region 501 has a fourth average pattern density PD4 that is between about 0.2 and about 0.8, such as about 0.456. The second die region 503 has a fifth average pattern density PD5 that is between about 0.2 and about 0.8, such as about 0.46. The third die region 505 has a sixth average pattern density PD6 that is between about 0.2 and about 0.8, such as about 0.46. The fourth die region 507, without the presence of a dummy insertion structure 127, has a seventh average pattern density PD7 that is between about 0.2 and about 0.8. The first set of overlay vectors 515 indicates directions and magnitudes of pattern density biases between neighboring die areas. A die region may be targeted for incorporation of the dummy insertion structure 127 based on the magnitudes and directions of the first set of overlay vectors 515 associated with the die region. For example, the fourth die region 507 may be designated as a die region targeted for incorporation of the dummy insertion structure 127 based on the first set of overlay vectors 515 associated with the first die region 501, the second die region 503, the third die region 505, and any other neighboring regions.

Where desired, based upon the first set of overlay vectors 515, the dummy insertion structure 127 may be inserted into a targeted die region (e.g., the fourth die region 507, the fifth die region 509, and the sixth die region 511). In the illustrated embodiment, the dummy insertion structure 127 may be placed within the fourth die region 507, the fifth die region 509, and the sixth die region 511. As such, the reduction in the difference between pattern densities will work to reduce the overly vectors, thereby reducing defects caused by overlay issues.

Figure 5B:
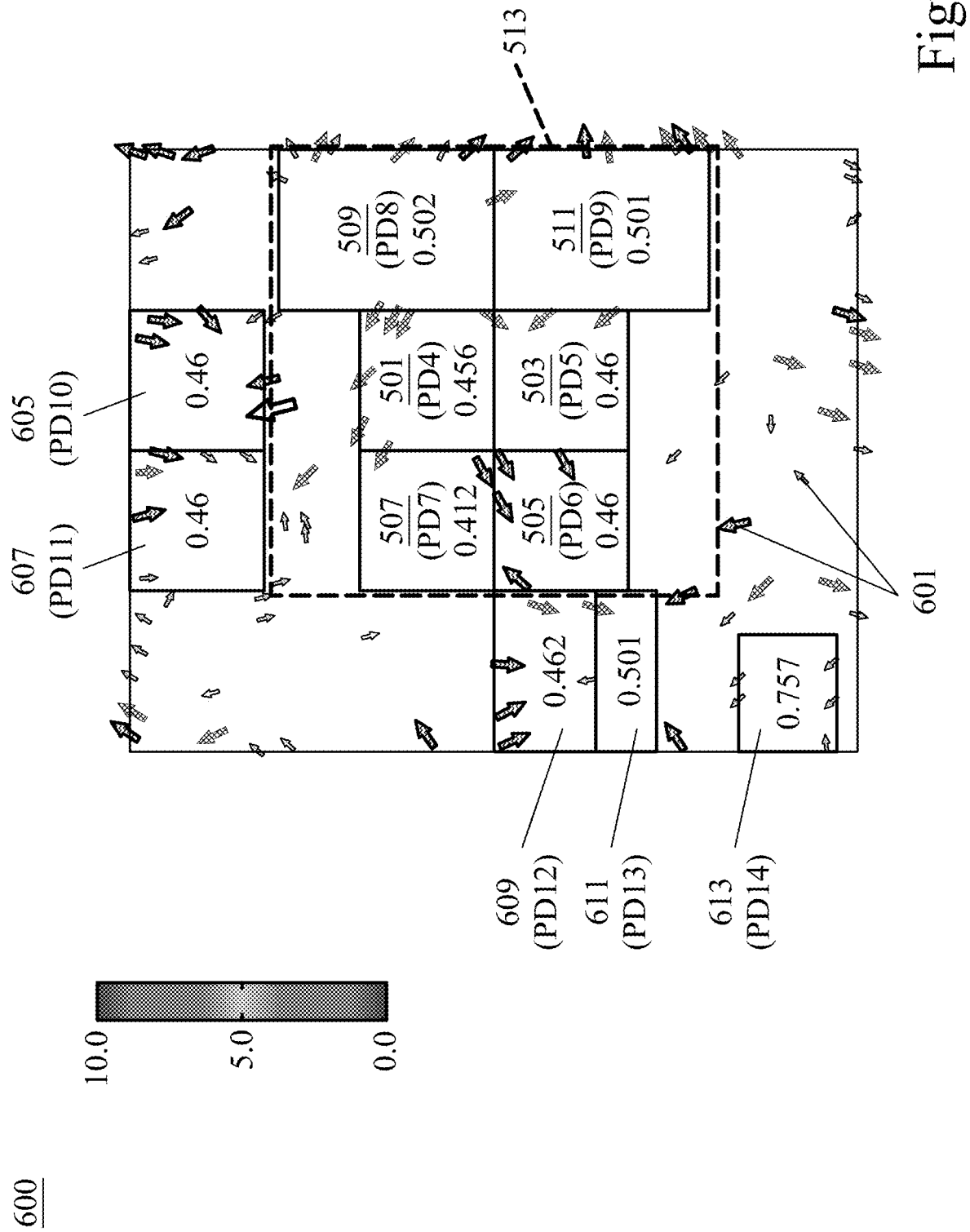
FIG. 5B illustrates a second intra overlay field map of a second group of die regions of the semiconductor devices to be formed, according to some embodiments.

FIG. 5B illustrates an expanded view of a second intra overlay field map 600 of the first group of die regions of the semiconductor devices to be formed using the embodiments described with respect to FIGS. 1-5A. In the illustrated embodiment of FIG. 5B, the first group of die regions (described above in relation to FIG. 5A) has the dummy insertion structures 127 formed within, e.g., the fourth die region 507, the fifth die region 509, and the sixth die region 511. FIG. 5B further illustrates a second set of overlay vectors 601 which take into account the presence of the dummy insertion structures 127, where in the second set of overlay vectors 601 are reduced in magnitude from the first set of overlay vectors 515 (see, e.g., FIG. 5A). Based on the pattern densities of the neighboring die regions at the top one of the IMD layers 121, the second set of overlay vectors 601 may have different magnitudes and different directions than the first set of overlay vectors 515. As such, the design may have a reduced intra overlay X/Y shift as compared to the design in FIG. 5A (e.g., without the dummy insertion structures 127). As such, overlay shifting during fabrication of the semiconductor devices may be reduced.

For example, in a particular embodiment, FIG. 5B illustrates a second group of die regions comprising the first group of die regions 513 and further comprising a seventh die region 605, an eighth die region 607, a ninth die region 609, a tenth die region 611, and an eleventh die region 613. FIG. 5B further illustrates the second set of overlay vectors 601 associated with each of these die regions. Each of the die regions may have a unique pattern density and depending on these unique pattern densities, a unique set of the second set of overlay vectors 601 may be determined for each of the die regions. Furthermore, each of the second set of overlay vectors 601 has a magnitude and a direction based on the pattern density of the metallic features and the material integrity of the IMD layer 121 within the neighboring die regions.

In the illustrated embodiment of FIG. 5B, the first die region 501 has the fourth average pattern density PD4, which in this embodiment is between about 0.2 and about 0.8, such as about 0.456. The second die region 503 has the fifth average pattern density PD5, which in this embodiment is between about 0.2 and about 0.8, such as about 0.46. The third die region 505 has the sixth average pattern density PD6 that is between about 0.2 and about 0.8, such as about 0.46. Additionally, the fourth die region 507, with the dummy insertion structures 127, has the seventh average pattern density PD7, now modified, of between about 0.2 and about 0.8, such as about 0.412.

Additionally, the fifth die region 509 (with an included dummy insertion structure 127) has an eighth average pattern density PD8 that is between about 0.2 and about 0.8, such as about 0.502. The sixth die region 511 has a ninth average pattern density PD9 that is between about 0.2 and about 0.8, such as about 0.501. The seventh die region 605 has a tenth average pattern density PD10 that is between about 0.2 and about 0.8, such as about 0.46. The eighth die region 607 has an eleventh average pattern density PD11 that is between about 0.2 and about 0.8, such as about 0.46. The ninth die region 609 has a twelfth average pattern density PD12 that is between about 0.2 and about 0.8, such as about 0.462. The tenth die region 611 has a thirteenth average pattern density PD13 that is between about 0.2 and about 0.8, such as about 0.501, and the eleventh die region 613 has a fourteenth average pattern density PD14 that is between about 0.2 and about 0.8, such as about 0.757.

The second set of overlay vectors 601 indicates directions and magnitudes of pattern density biases between neighboring die areas. As such, by including the dummy insertion structures 127, the second intra overlay X/Y average can be improved from a structure without the dummy insertion structures 127. For example, the first group of die regions 513 illustrated in FIG. 5A (e.g., without the presence of the dummy insertion structures 127) may have a first intra overlay shift average of about 13/12 prior to reducing any of the local pattern density biases between neighboring die regions. However, by including the dummy insertion structures 127, the regions illustrated in FIG. 5B may have a second intra overlay X/Y shift average of about 3.3/2.7. As such, the average overlay shift can be reduced such as a 74.6% reduction in the intra overlay X/Y shift by utilizing the dummy insertion structures 127. By reducing the possible overlay shifts during the manufacturing process, fewer defects will occur and a more robust manufacturing process may be obtained.

Figure 6:
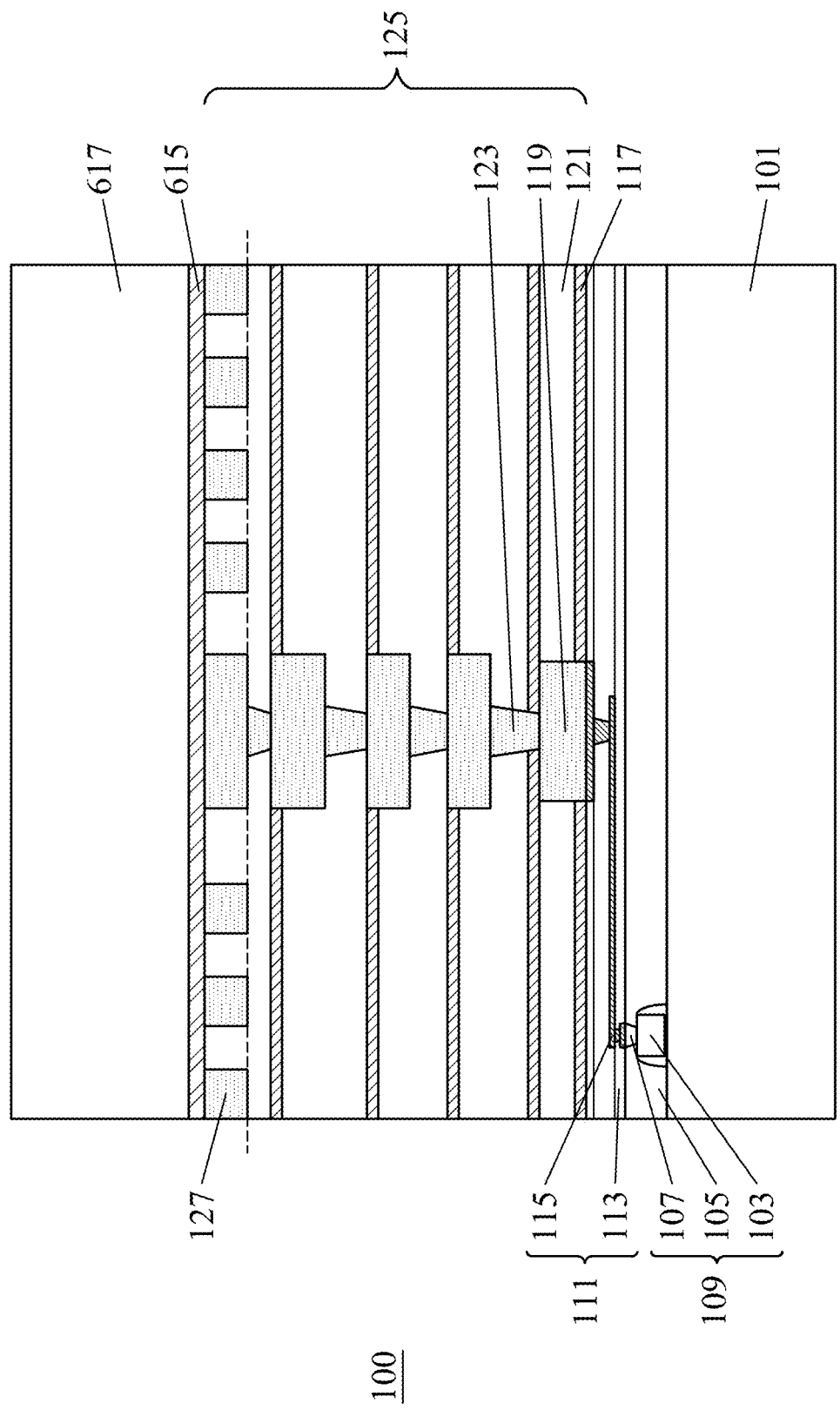
FIGS. 6-8 illustrate cross-sectional views of further processing of the semiconductor wafer at an intermediate step of manufacturing semiconductor dies, in accordance with some embodiments.

FIG. 6 illustrates that, once dummy insertion structure 127 has been formed, a first buffer layer 615 and a first bonding layer 617 may be deposited over the second interconnect structure 125. The first buffer layer 615 is formed over the second interconnect structure 125 to protect the second interconnect structure 125 during subsequent processing steps, such as deposition of the first bonding layer 617 discussed in greater detail below. The first buffer layer 615 may comprise a dielectric material, such as silicate glass, including undoped silicate glass (USG), oxides, combinations, or the like. The first buffer layer 615 may be deposited using a CVD process, such as high-density plasma CVD (HDP-CVD), or any suitable technique.

FIG. 6 further illustrates a formation of the first bonding layer 617 over the first buffer layer 615. The first bonding layer 617 may comprise a dielectric material, such as silicon oxide and may be deposited using a CVD process, such as HDP-CVD, or any suitable technique. In some embodiments, a high power plasma process may be used to decrease the frequency of defects in the deposited first bonding layer 617, and may further increase the density of the deposited first bonding layer 617 by forming tighter interconnections between the atoms. Once formed, the first bonding layer 617 may be planarized using a process such as chemical mechanical planarization. As such, the first bonding layer 617 may be formed with a robust durability and a smooth surface, thereby improving bonding of subsequent structures to the first bonding layer 617. The first buffer layer 615 prevents plasma induced damage (PID) to underlying conductive material, such as the metallization layers 119 of the second interconnect structure 125 during deposition of the first bonding layer 617.

In an embodiment the first buffer layer 615 and the first bonding layer 617 may be deposited to have a combined thickness between about 1,300 nm and about 3,200 nm, such as about 2,000 nm. For example, the first buffer layer 615 may be deposited to have a thickness between about 500 nm and about 1,200 nm, such as about 850 nm and the first bonding layer 617 may be deposited to have a thickness between about 800 nm and about 2,000 nm, such as about 1,400 nm.

Once formed, the first bonding layer 617 is thinned to further improve the planarity or flatness of a top surface of the first bonding layer 617. The thinning process may include a grinding process, a CMP, an etch-back, combinations thereof, or the like. After the thinning process, the first bonding layer 617 may have a thickness between about 500 nm and about 1,400 nm, such as about 800 nm. In addition, a combined thickness of the first bonding layer 617 and the first buffer layer 615 may be between about 500 nm and about 1,200 nm, such as about 850 nm.

The first buffer layer 615 prevents plasma induced damage (PID) to underlying conductive material, such as the metallization layers 119 and/or dummy insertion structure 127 of the second interconnect structure 125 during deposition of the first bonding layer 617.

Figure 7:
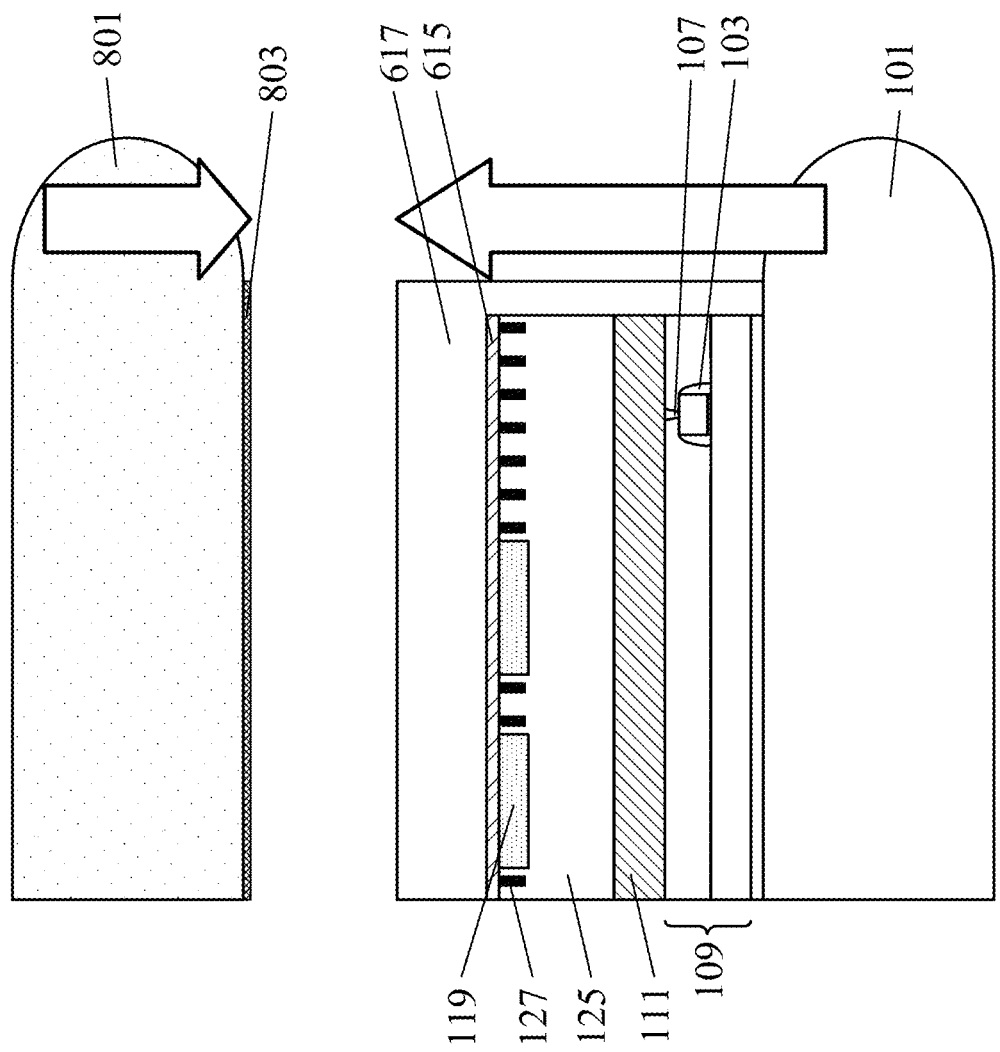

FIG. 7 illustrates a wafer bonding process 800, according to some embodiments. A carrier wafer 801 may be bonded to the first bonding layer 617 using a suitable technique, such as dielectric-to-dielectric bonding, or the like. The dielectric-to-dielectric bonding may be performed by initially depositing a second bonding layer 803 over a surface of the carrier wafer 801 prior to the bonding. The second bonding layer 803 may comprise an oxide (e.g., silicon oxide or the like) that is deposited by CVD (e.g., HDP), ALD, PVD, thermal oxidation, or the like). Other suitable materials and processes may be used to form the second bonding layer 803. The second bonding layer 803 may be deposited to have a thickness of between about 20 nm and about 100 nm.

The dielectric-to-dielectric bonding process may further include applying a surface treatment to one or more of the first bonding layer 617 and the second bonding layer 803. For example, the surface treatment may include a plasma treatment performed in a vacuum environment. After the plasma treatment, the surface treatment may further include a cleaning process (e.g., a rinse with deionized water or the like) that may be applied to one or more of the first bonding layer 617 and the second bonding layer 803. The carrier wafer 801 is then aligned with the second interconnect structure 125, and the two are pressed against each other to initiate a bonding of the carrier wafer 801 to the second interconnect structure 125. In some embodiments, the bonding process causes dangling bonds along the surface of the first bonding layer 617 to form chemical bonds with atoms or molecules along the surface of the second bonding layer 803, and/or vice versa. As a result, a bonded interface is formed between the first bonding layer 617 and the second bonding layer 803.

Figure 8:
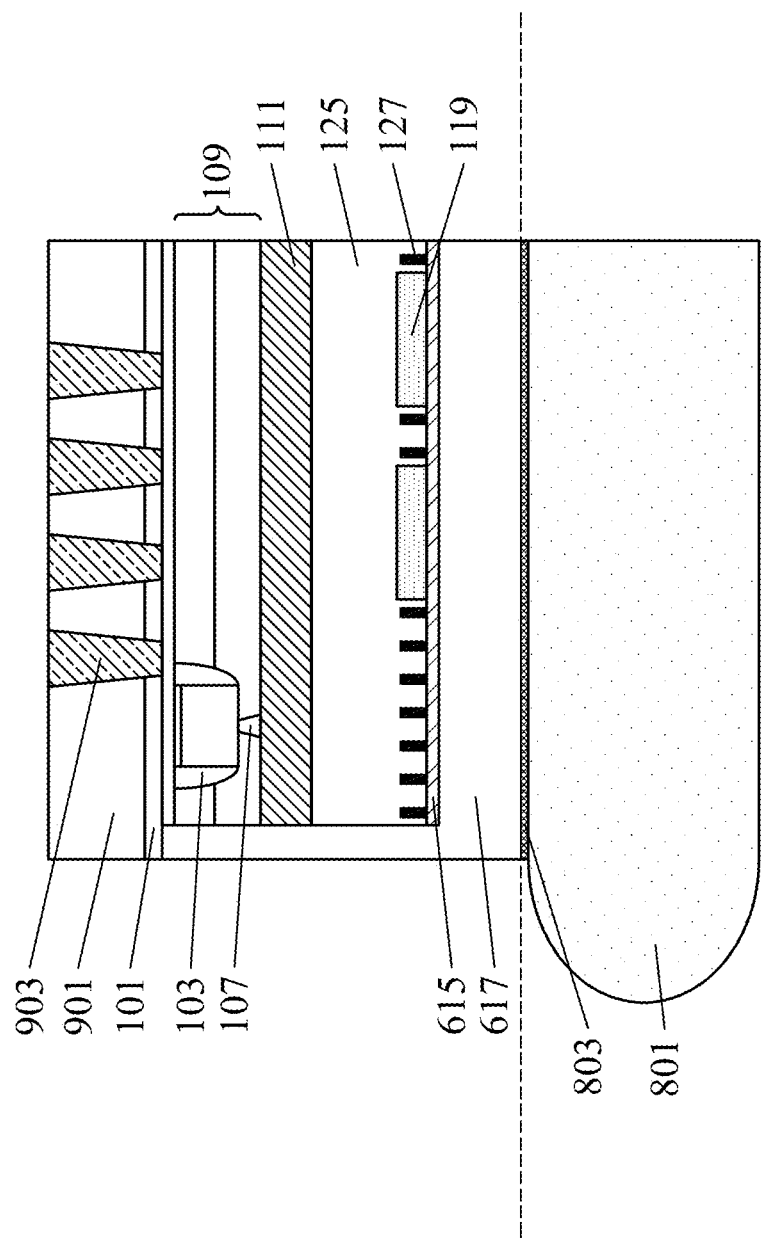

FIG. 8 illustrates formation of an optional backside ILD 901 and back-side vias 903 over a back-side of the FEOL layer 109, according to some embodiments. Once the carrier wafer 801 has been bonded and the workpiece flipped over, further processing may be performed at a back-side of the FEOL layer 109. For example, materials of the semiconductor substrate 101 may be removed using one or more processes, such as a thinning process, including a grinding process, a CMP, an etch-back, combinations thereof, or the like. In some embodiments, a grinding process or CMP is performed to remove a majority of the semiconductor substrate 101 and then followed by a suitable etch-back process to remove either a remainder of the semiconductor substrate 101 or to form openings (not specifically illustrated) in the semiconductor substrate 101 to expose certain portions of the electronic elements 103 and/or the first conductive features 115. For example, back-side vias 903 may be formed over the FEOL layer 109 (e.g., in the openings) to be electrically connected to, for example, contact areas of the electronic elements 103 (e.g., source/drain regions of transistors) in the FEOL layer 109. In some embodiments, the optional backside ILD 901 may be formed over the remaining portion of the semiconductor substrate 101. Once the optional backside ILD 901 has been formed, the openings (not specifically illustrated) may be formed through the optional backside ILD 901 and the semiconductor substrate 101 prior to forming the back-side vias 903.

FIG. 8 further illustrates the formation of the back-side vias 903 in the openings. The back-side vias 903 are each electrically connected to a respective underlying first conductive feature of the FEOL layer 109. The back-side vias 903 may therefore be electrically connected to the electronic elements 103 in the device layer through the semiconductor substrate 101 and/or the first interconnect structure 111. The back-side vias 903 may each comprise one or more layers, such as barrier layers, diffusion layers, and conductive fill materials. For example, in some embodiments, the back-side vias 903 each include a barrier layer and a conductive fill material. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the optional backside ILD 901. Following the planarization, the back-side vias 903 and the optional backside ILD 901 are level. In addition, the back-side vias 903 may have a height of greater than about 1,400 nm, such as between about 1,400 nm and about 2,000 nm.

By using the dummy insertion structures 127 as described above, the overlay offsets that would otherwise occur during the manufacturing process (as illustrated by the reduced overlay vectors 515) can be better controlled. In particular, by including the dummy insertion structures 127, the local pattern densities can be made more uniform, leading to a reduction or even elimination of overlay errors that would otherwise occur. As such, the number of defects that would occur because of these overlay errors can be reduced, allowing for a more efficient manufacturing process.

Figure 9:
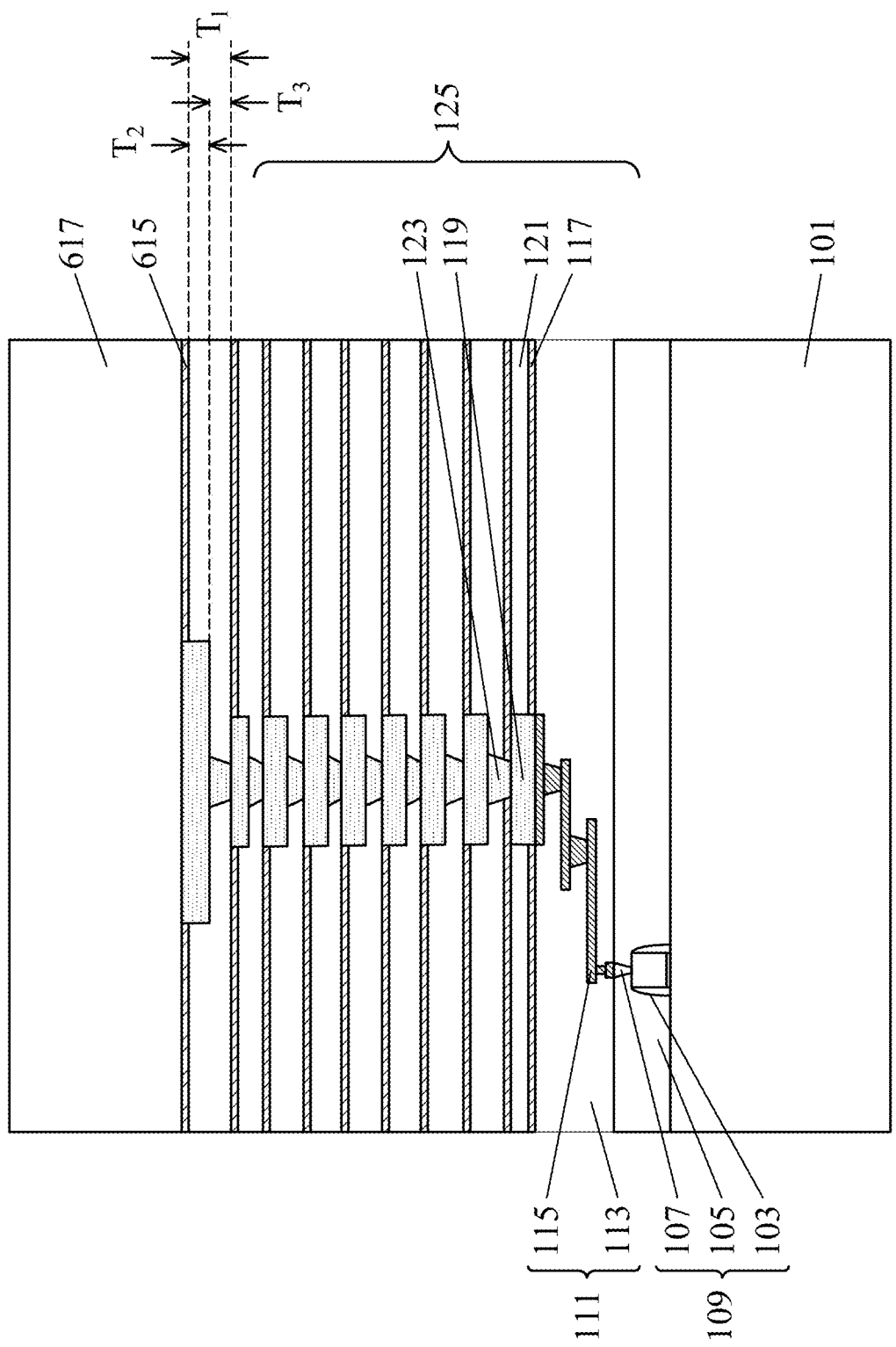
FIG. 9 illustrates a cross-sectional view of forming conductive features in a semiconductor wafer at an intermediate step of manufacturing semiconductor dies, according to some embodiments.

FIG. 9 illustrates another embodiment which may be utilized in order to help reduce the overlay offsets, but which does not necessarily use the dummy insertion structure 127 (although the dummy insertion structures 127 may be utilized if desired). Rather, in the embodiment illustrated in FIG. 9, a thickness of the top IMD layers 121 is reduced to a level that reduces the stress differences between the metals (e.g., the metallization layers 119 and the TIVs 123 within the IMD layers 121) and the IMD layers 121.

Looking at FIG. 9, this figure is similar to FIG. 1 except the dummy insertion structures 127 are not formed in the topmost layer of the IMD layers 121. Furthermore, the embodiment illustrated in FIG. 9 comprises three layers of the first conductive features 115 in the first interconnect structure 111 and nine of the metallization layers 119 (e.g., M0-M8) in the second interconnect structure 125.

However, looking at the top IMD layers 121 of the second interconnect structure 125, a first thickness $T_1$ of the top one of the IMD layers 121 is limited to be between about 9 nm and about 1,445 nm. Additionally, the metallization layers 119 located within the top IMD layers 121 may be formed to have a second thickness $T_2$ of between about 9 nm and about 850 nm, while the TIVs 123 located within the top IMD layers 121 may be formed to have a third thickness $T_3$ of between about 0 nm and about 595 nm. However, any suitable thicknesses may be utilized.

Figure 10A:
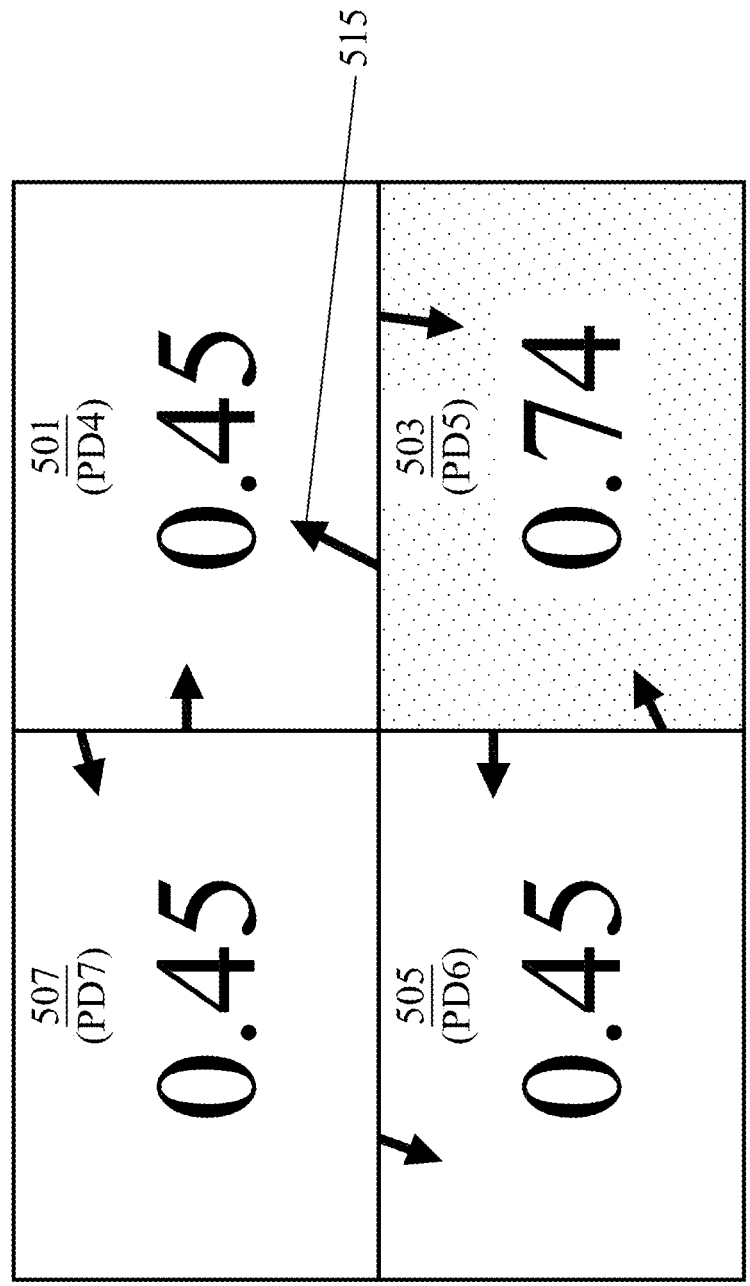
FIGS. 10A-10B illustrate resultant benefits of the structure of FIG. 9, according to some embodiments.

FIG. 10A illustrates a top-down view of the first die region 501, the second die region 503, the third die region 505, and the fourth die region 507. In this embodiment, however, the dummy insertion structures 127 have not been placed into any of the regions, and the top IMD layers 121 have been modified and restricted as described above with respect to FIG. 9. Additionally, the first die region 501 has the fourth pattern density PD4 (e.g., 0.45), the second die region 503 has the fifth pattern density (e.g., 0.74), the third die region 505 has the sixth pattern density (e.g., 0.45), and the fourth die region 507 has the seventh pattern density PD7 (e.g., 0.45).

However, even with the large variances between the patterned densities (e.g., the difference between 0.74 and 0.45), the first set of overlay vectors 515 can be reduced when a separate top metal layer (e.g., with a contact pad formed therein) is not formed and, as discussed above with respect to FIG. 9, when the top layer of the second interconnect structure 125 is limited in thickness. As such, the regions illustrated in FIG. 10A may have an intra overlay X/Y shift average of about 4.1/3.6. As such, the average overlay shift can be reduced such as a 62.7% reduction in the intra overlay X/Y shift.

Figure 10B:
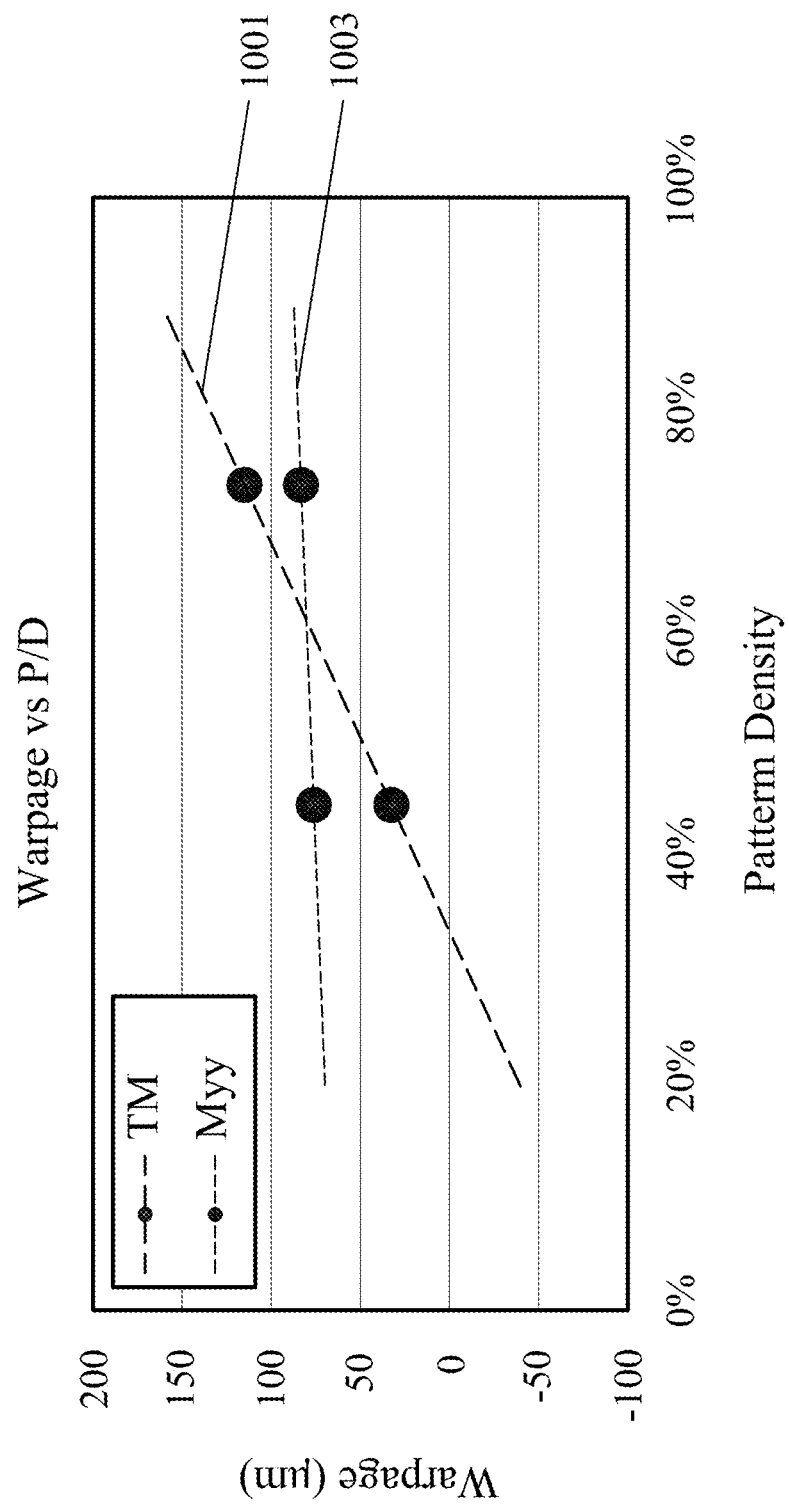

FIG. 10B illustrates other benefits of this embodiment, in which FIG. 10B is a chart illustrating warpage bias vs. pattern densities of the semiconductor dies during a planarization process. In particular, FIG. 10B illustrates the warpage vs. pattern density of the die regions during planarization when a separate top metal layer (e.g., with a contact pad formed therein) is not formed and, as discussed above with respect to FIG. 9, when the top layer of the second interconnect structure 125 is limited in thickness. In some embodiments, the line representing the separate top metal layer (labeled 1001 in FIG. 10B) may be determined by the formula: "y =287.02x-97.318". Additionally, the line representing the embodiment in which the top layer of the second interconnect structure 125 is limited (labeled 1003 (Myy) in FIG. 10B) may be determined by the formula: "y=25.538x+ 65.129". Warpage may also be determined using the formula: "$W \propto t^* \Delta \sigma$", where W is warpage, t is layer thickness, and $\Delta \sigma$ is stress differential. In the illustrated embodiments, the metallization layers 119 may be formed using copper materials (at a thickness of, e.g., 1,500 Å), low-k dielectric materials (at a thickness of, e.g., 1,500 Å). During planarization, the copper materials may experience a stress of about 400 MPa, the low-k dielectric material may experience a stress of about 65 MPa (whereas an undoped silicon glass used in a separate top metal layer may experience a stress of about −200 MPa).

In embodiments where the top layer of the second interconnect structure 125 is limited, a first die region with a relatively high pattern density of about 74% and a second die region having a relatively low pattern density of about 45% have a warpage bias between about 1 µm and about 15 µm, such as about 7 µm. Such a warpage bias is much less than previous structures which utilize a separate top metal layer (with, e.g., contact pads formed therein) with an unconstrained thickness, which may have a warpage bias of as high as 83 µm, or 12 times higher). As such, using the top layer of the second interconnect structure 125 with a limited thickness, along with foregoing the presence of an overlying separate top metal layer, provides an improved overlay performance as compared to forming the metallization layer 119 at the TM stage.

Returning now to FIG. 9, FIG. 9 additionally illustrates that, once the top layer of the second interconnect structure 125 has been formed, the first buffer layer 615 and the first bonding layer 617 are formed over the second interconnect structure 125. In an embodiment the first buffer layer 615 and the first bonding layer 617 are formed as described above with respect to FIG. 6. However, any suitable methods and materials may be utilized.

Figure 11:
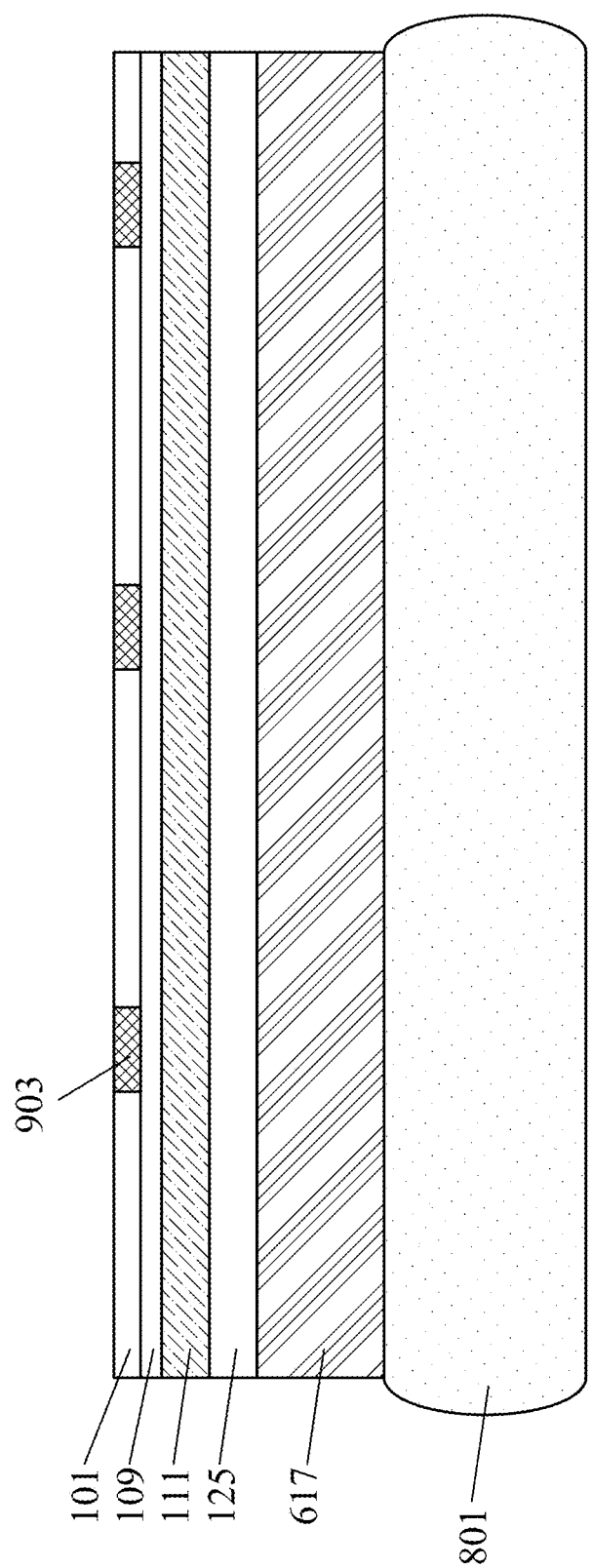
FIG. 11 illustrates further processing of the semiconductor wafer, in accordance with some embodiments.

FIG. 11 illustrates that, once the first buffer layer 615 and the first bonding layer 617 have been formed, further processing may be performed. In an embodiment the further processing may include bonding the carrier wafer 801 to the first bonding layer 617, thinning down the semiconductor substrate 101 using, e.g., a chemical mechanical polishing process, and forming the back-side vias 903. In an embodiment these steps may be performed as described above with respect to FIG. 8, although any suitable methods may be utilized.

Embodiments disclosed herein are directed towards reducing the overlay shift within the manufacturing process. In embodiments the overlay shift may be reduced by either adding in dummy insertion structures 127, limiting the height of top layers of the second interconnect structure 125, or combinations of these. By either reducing an average pattern density (by, e.g., inserting the dummy insertion structures 127) or else limiting the effect of pattern density gradients (by, e.g., limiting the thickness of the layers), the overlay shifts that would otherwise occur can be reduced, thereby reducing defects and improving yields.

According to an embodiment, a method includes: forming a metallization layer in a dielectric layer overlying an interconnect structure, the interconnect structure being over a device wafer with a first integrated circuit; and forming a dummy insertion structure within the dielectric layer, the dummy insertion structure having a stepped pattern density. In an embodiment, the dummy insertion structure is formed adjacent a die region having a pattern density that is greater than the stepped pattern density. In an embodiment, the forming the dummy insertion structure comprises forming a first set of dummy insertion structures having a first pattern density and forming a second set of dummy insertion structures having a second pattern density, the second pattern density being less than the first pattern density. In an embodiment, the first set of dummy insertion structures are formed in a first area of the dielectric layer and the second set of dummy insertion structures are formed in a second area of the dielectric layer, the second area embedded within the first area. In an embodiment, the first set of the dummy insertion structures has a first width and the second set of the dummy insertion structures has a second width, the second width being smaller than the first width. In an embodiment, the first set of the dummy insertion structures has a first displacement between dummy insertion structures and the second set of the dummy insertion structures has a second displacement, the second displacement being smaller than the first displacement. In an embodiment, the method further includes: forming a first bonding layer over the dummy insertion structure, the metallization layer, and the dielectric layer; forming a second bonding layer over a carrier wafer; and pressing the second bonding layer onto the first bonding layer.

In another embodiment, a method includes: forming an integrated circuit over a device substrate; forming a metallization layer over the integrated circuit, the metallization layer being electrically coupled to the integrated circuit; forming a dielectric layer over the metallization layer; forming first recesses within the dielectric layer, the first recesses being located in a first die region and having a first pattern density; forming second recesses in the dielectric layer adjacent to the first die region, the second recesses being located in a second die region and having a second pattern density that is less than the first pattern density; depositing a metallization layer material in the first recesses and the second recesses; and planarizing the metallization layer material with the dielectric layer to form first conductive features in the first recesses and second conductive features in the second recesses, a warpage bias between the first die region and the second die region being less than or equal to 7 µm. In an embodiment the metallization layer is electrically coupled to the integrated circuit by a stack of metallization layers, the metallization layer being a ninth layer in the stack of metallization layers. In an embodiment a thickness of the dielectric layer is less than or equal to 150 nm. In an embodiment the first pattern density and the second pattern density are average pattern densities within a range between 45% and 74%, inclusive. In an embodiment the method further includes: forming third recesses in the dielectric layer within the second die region, the third recesses being located between the first recesses and the second recesses and the third recesses comprising a third pattern density, the third pattern density being between the first pattern density and the second pattern density; depositing a dummy material in the third recesses; and planarizing the dummy material with the dielectric layer to form a group of dummy insertion structures in the third recesses. In an embodiment the method further includes: forming an opening through the device substrate; and forming a conductive via in the opening. In an embodiment the method further includes: forming a first bonding layer over the device substrate; forming a second bonding layer over a carrier wafer; and pressing the second bonding layer onto the first bonding layer.

In yet another embodiment, a semiconductor device includes: a first die region over a semiconductor substrate, the first die region comprising a first metallization layer having a first pattern density; a second die region over the semiconductor substrate adjacent the first die region, the second die region comprising a second metallization layer having a second pattern density that is less than the first pattern density; and a dummy insertion arrangement embedded between the first metallization layer and the second metallization layer, the dummy insertion arrangement having a step pattern density. In an embodiment the dummy insertion arrangement comprises a first set of dummy insertion structures having a third pattern density and a second set of dummy insertion structures having a fourth pattern density, the fourth pattern density being less than the third pattern density and the third pattern density being less than the first pattern density. In an embodiment the first set of dummy insertion structures are located in a first area and the second set of dummy insertion structures are located in a second area, the second area embedded within the first area. In an embodiment a first one of the first set of the dummy insertion structures has a first width and a second one of the second set of the dummy insertion structures has a second width, the second width being smaller than the first width. In an embodiment a first one of the first set of the dummy insertion structures has a first length and a second one of the second set of the dummy insertion structures has a second length, the second length being smaller than the first length. In an embodiment the first set of the dummy insertion structures has a first displacement between dummy insertion structures and the second set of the dummy insertion structures has a second displacement between dummy insertion structures, the second displacement being smaller than the first displacement.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a metallization layer in a dielectric layer overlying an interconnect structure, the interconnect structure being over a device wafer with a first integrated circuit; and
   forming a dummy insertion structure within the dielectric layer, the dummy insertion structure having a stepped pattern density and including a first pattern density region of a first set of dummy insertion features and a second pattern density region of a second set of dummy insertion features, the second pattern density region is embedded within a perimeter of the first pattern density region, wherein a first density of patterns in the first pattern density region is different from a second density of patterns in the second pattern density region, and the first pattern density region and the second pattern density region are both within a same level of the dielectric layer.

2. The method of claim 1, wherein the dummy insertion structure is formed adjacent a die region having a pattern density that is greater than the stepped pattern density.

3. The method of claim 1, wherein the first set of the dummy insertion features has a first width and the second set of the dummy insertion features has a second width, the second width being smaller than the first width.

4. The method of claim 1, wherein the first set of the dummy insertion features has a first displacement between first dummy insertion structures and the second set of the dummy insertion features has a second displacement between second dummy insertion structures, the second displacement being smaller than the first displacement.

5. The method of claim 1, further comprising:
   forming a first bonding layer over the dummy insertion structure, the metallization layer, and the dielectric layer;
   forming a second bonding layer over a carrier wafer; and
   pressing the second bonding layer onto the first bonding layer.

6. The method of claim 1, wherein the dummy insertion structure having the stepped pattern density further includes a third pattern density region of a third set of dummy insertion features embedded within a perimeter of the second pattern density region of the second set of dummy insertion features.

7. The method of claim 1, wherein at least one of the first set of dummy insertion features and the second set of dummy insertion features comprises metal features.

8. A method comprising:
   forming an integrated circuit over a device substrate;
   forming an interconnect structure over the integrated circuit, conductive elements of the interconnect structure being electrically coupled to the integrated circuit;
   forming a dielectric layer over the interconnect structure;
   forming first recesses within the dielectric layer, the first recesses being located in a first die region and having a first pattern density;
   forming second recesses in the dielectric layer in a second die region adjacent to the first die region, the second recesses having a second pattern density that is less than the first pattern density;
   depositing a metallization layer material in the first recesses and the second recesses; and
   planarizing the metallization layer material with the dielectric layer to form first conductive features in the first recesses and second conductive features in the second recesses, wherein the second conductive features form dummy insertion structures including a first pattern density region of a first set of dummy insertion features and a second pattern density region of a second set of dummy insertion features, the second pattern density region contained within a perimeter of the first pattern density region, wherein the first pattern density region and the second pattern density region are both within a same level of the dielectric layer.

9. The method of claim 8, further comprising:
   forming a bonding layer over the first conductive features and the second conductive features; and
   bonding the device substrate to a carrier substrate using the bonding layer.

10. The method of claim 8, wherein the dummy insertion structures have a stepped pattern in a plan view.

11. The method of claim 8, further comprising:
    forming third recesses in the dielectric layer in a third die region, the third die region being adjacent the second die region, the third recesses having a third pattern density that is different than the second pattern density, wherein depositing the metallization layer material comprises depositing the metallization layer material in the third recesses, and
    wherein planarizing the metallization layer material forms third conductive features in the third recesses, wherein the third conductive features form the second set of the dummy insertion features.

12. The method of claim 11, wherein the third pattern density is greater than the second pattern density.

13. The method of claim 8, wherein the dummy insertion structure further includes a third pattern density region of a third set of dummy insertion features embedded within a perimeter of the second pattern density region of the second set of dummy insertion features.

14. A method comprising:
    forming one or more electronic elements on a device substrate, forming an interconnect structure over the one or more electronic elements, the interconnect structure comprising an upper interconnect layer, wherein forming the upper interconnect layer comprises:

forming a first dielectric layer;

forming first recesses in a first die region of the first dielectric layer;

forming first dummy recesses in a second die region of the first dielectric layer, wherein the second die region is adjacent the first die region, wherein a second pattern density of the second die region is less than a first pattern density of the first die region; and filling the first recesses and the first dummy recesses with a conductive material to form first conductive features in the first recesses and dummy insertion structures in the first dummy recesses, the first conductive features are electrically coupled to the one or more electronic elements, wherein the dummy insertion structures include a first pattern density region of a first set of dummy insertion features and a second pattern density region of a second set of dummy insertion features, the second pattern density region contained within a perimeter of the first pattern density region, wherein the first pattern density region and the second pattern density region are both within a same level of the first dielectric layer.

15. The method of claim 14, further comprising:

forming second recesses in a third die region of the first dielectric layer, wherein filling the first recesses and the first dummy recesses comprises filling the second recesses to form second conductive features, wherein the second conductive features are electrically coupled to the one or more electronic elements, wherein the second die region is in contact with the first die region and the third die region in a plan view.

16. The method of claim 14, wherein forming the first dummy recesses comprises:

forming a first subset of recesses in a first subset pattern; and forming a second subset of recesses in a second subset pattern, wherein a density of the first subset pattern is different than a density of the second subset pattern.

17. The method of claim 16, wherein the second subset pattern provides the second pattern density region and surrounds the first subset pattern that provides the first pattern density region in a plan view.

18. The method of claim 17, wherein the density of the first subset pattern is greater than the density of the second subset pattern.

19. The method of claim 16, wherein forming the first dummy recesses comprises:

forming a third subset of recesses in a third subset pattern, wherein a density of the third subset pattern is different than the density of the first subset pattern and the density of the second subset pattern.

20. The method of claim 19, wherein the first subset pattern surrounds the third subset pattern in a plan view.

* * * * *